US011825570B2

(12) United States Patent
Kuo et al.

(10) Patent No.: US 11,825,570 B2
(45) Date of Patent: Nov. 21, 2023

(54) HEATER PACKAGE

(71) Applicant: Industrial Technology Research Institute, Hsinchu (TW)

(72) Inventors: Yen-Ching Kuo, Keelung (TW); Chien-Chang Hung, Hsinchu (TW); Hong-Ming Dai, Tainan (TW); Jane-Hway Liao, Hsinchu County (TW); Hung-Yi Chen, New Taipei (TW); Shu-Tang Yeh, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 948 days.

(21) Appl. No.: 16/684,597

(22) Filed: Nov. 15, 2019

(65) Prior Publication Data

US 2020/0163166 A1 May 21, 2020

Related U.S. Application Data

(60) Provisional application No. 62/768,114, filed on Nov. 16, 2018.

(30) Foreign Application Priority Data

Oct. 8, 2019 (TW) ................................ 108136359

(51) Int. Cl.
*H05B 3/36* (2006.01)
*H05B 3/03* (2006.01)
(Continued)

(52) U.S. Cl.
CPC ................ *H05B 3/36* (2013.01); *H05B 3/03* (2013.01); *H05B 3/04* (2013.01); *H05B 3/146* (2013.01); *H05B 2203/017* (2013.01)

(58) Field of Classification Search
CPC ... H05B 3/36; H05B 3/03; H05B 3/04; H05B 3/146; H05B 3/12; H05B 3/141;
(Continued)

(56) References Cited

U.S. PATENT DOCUMENTS 3,763,004 A * 10/1973 Wainer ............... C23C 18/1608 430/311
5,907,382 A 5/1999 Kajiura et al.
(Continued)

FOREIGN PATENT DOCUMENTS

CN 202799224 3/2013
CN 202913598 5/2013
(Continued)

OTHER PUBLICATIONS

Office Action of China Counterpart Application, dated Jul. 16, 2021, pp. 1-5.
(Continued)

*Primary Examiner* — Shawntina T Fuqua
(74) *Attorney, Agent, or Firm* — JCIPRNET

(57) ABSTRACT

An embodiment of the disclosure provides a heater package including a substrate, a first barrier layer, at least one heater, and a second barrier layer. The first barrier layer is disposed on a surface of the substrate and has a first treatment layer on a side away from the substrate. The heater is disposed on the substrate and includes a heating layer and at least one electrode. The at least one electrode and the heating layer contact with each other. The second barrier layer covers an upper surface and a sidewall of the heater and has a second treatment layer on an opposite side or the side away from the substrate. A ratio of a thickness of the first treatment layer to a thickness of the first barrier layer and a ratio of a thickness of the second treatment layer to a thickness of the second barrier layer range from 0.03 to 0.2.

20 Claims, 10 Drawing Sheets

(51) Int. Cl.
*H05B 3/04* (2006.01)
*H05B 3/14* (2006.01)

(58) Field of Classification Search
CPC .... H05B 3/145; H05B 3/84; H05B 2203/017; H05B 2214/04
See application file for complete search history.

(56) References Cited

U.S. PATENT DOCUMENTS

| | | | | |
|---|---|---|---|---|
| 5,911,899 | A * | 6/1999 | Yoshikai .................. | H05B 3/86 219/522 |
| 6,222,166 | B1 | 4/2001 | Lin et al. | |
| 2002/0195444 | A1 | 12/2002 | Lin et al. | |
| 2005/0224935 | A1 * | 10/2005 | Schaepkens ........ | H01L 51/5259 257/678 |
| 2006/0226523 | A1 | 10/2006 | Foust et al. | |
| 2010/0329964 | A1 | 12/2010 | Roos | |
| 2013/0248828 | A1 * | 9/2013 | Schaepkens ........ | H01L 51/0097 257/40 |

FOREIGN PATENT DOCUMENTS

| | | |
|---|---|---|
| CN | 104118149 | 10/2014 |
| CN | 204531287 | 8/2015 |
| CN | 206389568 | 8/2017 |
| CN | 206724290 | 12/2017 |
| CN | 108505715 | 9/2018 |
| CN | 208668870 | 3/2019 |
| TW | 201216368 | 4/2012 |
| TW | I504307 | 10/2015 |

OTHER PUBLICATIONS

"Office Action of Taiwan Counterpart Application", dated Sep. 18, 2020, p. 1-p. 5.

* cited by examiner

HEATER PACKAGE

CROSS-REFERENCE TO RELATED APPLICATION

This application claims the priority benefits of U.S. provisional application No. 62/768,114, filed on Nov. 16, 2018 and Taiwan application serial no. 108136359, filed on Oct. 8, 2019. The entirety of each of the above-mentioned patent applications is hereby incorporated by reference.

TECHNICAL FIELD

The technical field relates to a heater package.

BACKGROUND

Electric heating technology has the advantages of high heat conversion efficiency, convenient installation design, and the like and thus has been widely applied in the fields of building engineering, household appliances, decoration, and so on. In recent years, due to the rise of automotive and intelligent wearable devices, the research of flexible heaters has attracted more and more attention. However, an electrode and/or a heating layer in the heater are apt to be damaged by moisture and/or oxygen, and how to increase a barrier capability of the heater against moisture and/or oxygen through the packaging technology and balance the stress of the heater package and protect the heater package from being warped easily so as to improve reliability and prolong a service life of the heater package should be taken into account.

SUMMARY

A heater package according to one embodiment includes a substrate, a first barrier layer, at least one heater, and a second barrier layer. The first barrier layer is disposed on a surface of the substrate and includes a first treatment layer on a side away from the substrate. The heater is disposed on the substrate, and the heater includes a heating layer and at least one electrode, wherein the at least one electrode and the heating layer are in contact with each other. The second barrier layer covers an upper surface and a sidewall of the heater and has a second treatment layer on the side or an opposite side away from the substrate. A ratio of a thickness of the first treatment layer to a thickness of the first barrier layer and a ratio of a thickness of the second treatment layer to a thickness of the second barrier layer range from 0.03 to 0.2.

The heater package according to one embodiment includes a substrate, at least one heater, and a first barrier layer. The heater is disposed on the substrate, and the heater includes a heating layer and at least one electrode, wherein the at least one electrode and the heating layer are in contact with each other. The first barrier layer covers an upper surface, a lower surface, and a sidewall of the substrate and an upper layer and a sidewall of the heater, and has a first treatment layer on a side away from the substrate. A ratio of a thickness of the first treatment layer to a thickness of the first barrier layer ranges from 0.03 to 0.2.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
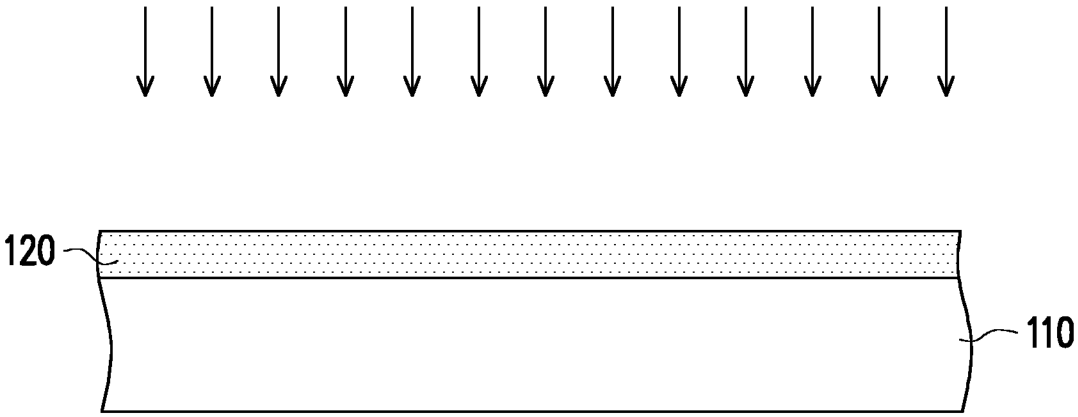
FIGS. 1A-1F are schematic partial cross-sectional views illustrating a process of producing a heater package according to a first embodiment of the disclosure.

The directional terms mentioned in the embodiments, like "above", "below", "front", "back", "left", and "right", refer to the directions in the appended drawings. Therefore, the directional terms are only used for illustration instead of limiting the embodiments. In the drawings, the figures depict general features of methods, structures, and/or materials used in certain exemplary embodiments. However, these drawings should not be construed as defining or limiting the scope or nature of what is covered by these exemplary embodiments. For instance, the relative thicknesses and locations of various film layers, regions, and/or structures may be reduced or enlarged for clarity. Same reference numerals in the following description should be deemed as referring to same or similar elements when appearing in different drawings. These embodiments are only a part of rather than all embodiments. More precisely, these embodiments are merely examples of a heater package.

FIGS. 1A-1F are schematic partial cross-sectional views illustrating a process of producing a heater package according to a first embodiment. Referring to FIG. 1A, a substrate 110 is first provided. The substrate 110 may be a hard substrate or a flexible substrate allowing visible light to pass through. For instance, the material of the hard substrate is glass, wafer, or other hard materials, and the material of the flexible substrate is polyethylene terephthalate (PET), polyimide (PI), polycarbonate (PC), polyamide (PA), polyethylene naphthalate (PEN), polyethylenimine (PEI), polyurethane (PU), polydimethylsiloxane (PDMS), an acrylic polymer such as polymethylmethacrylate (PMMA), an ether polymer such as polyethersulfone (PES) or polyetheretherketone (PEEK), polyolefin, thin glass, or other flexible materials, which should not be limited in this disclosure.

Next, a first barrier layer 120 is formed on the substrate 110 through a solution process, and then the first barrier layer 120 is cured. The first barrier layer 120 may cover a surface of the substrate 110. A material of the first barrier layer 120 used in the solution process may include polysilazane, polysiloxazane, or other suitable materials.

In this embodiment, the exposed surface of the cured first barrier layer 120 may be modified by light, heat or plasma treatment to enhance barrier properties of the first barrier layer 120. For instance, the light treatment may be performed by using vacuum ultraviolet light (VUV); the heat treatment may be heating by using a hot plate, an oven or the like, and the gas used may include air, nitrogen ($N_2$), oxygen ($O_2$), and so on; the plasma treatment may include plasma modification using an inert gas, hydrogen ($H_2$), nitrogen ($N_2$), oxygen ($O_2$), a fluorine-containing gas, chlorine ($Cl_2$), or the like. The material of the first barrier layer 120 that have been surface-modified may include silicon nitride, silicon oxynitride, or other suitable materials.

Figure 1B:
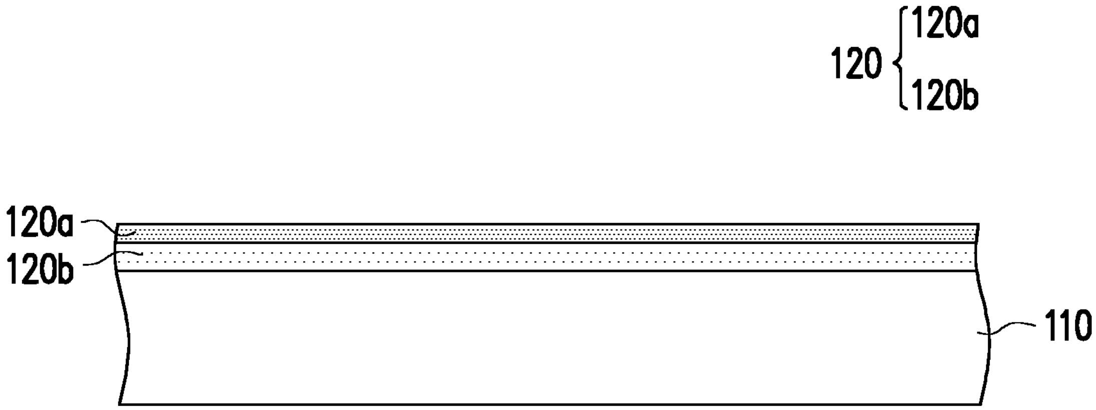

Then, referring to FIG. 1B, after the treatment, a first treatment layer 120*a* is formed on the first barrier layer 120 on a side away from the substrate 110, and therefore, the first barrier layer 120 includes the first treatment layer 120*a* and an untreated layer 120*b*. The density of the first treatment layer 120*a* such as silicon nitride or silicon oxynitride is higher than the untreated layer 120*b*. In one embodiment, the nitrogen content in the first treatment layer 120*a* is more than in the untreated layer 120*b*. In general, the composition of the first barrier layer 120 may include a nitrogen (N) content from 5 at % to 30 at %, an oxygen (O) content from 20 at % to 50 at %, and a silicon (Si) content from 30 at % to 50 at %, where at % is the atom percent, and the sum of the silicon element content, the nitrogen element content, and the oxygen element content is 100 at %; a density of the first barrier layer 120 may be—2.2 g/$cm^3$ or higher, a water vapor transmission rate (WVTR) may be—less than or equal to $10^{-1}$ g/$cm^2$-day, and a refractive index may be 1.50 to 1.60.

In one embodiment, the composition of the first barrier layer 120 may be analyzed by using energy dispersive spectroscopy (EDS), X-ray photoelectron spectroscopy (XPS), or other suitable methods. An energy dispersive X-ray spectrometer may be attached to an instrument such as a scanning electron microscopy (SEM) or transmission electron microscopy (TEM) instrument for element analysis using, for instance, line scan or single point measurement. Element analysis may be performed by the single point measurement or depth measurement methods of X-ray photoelectron spectrometer, and the composition of the first barrier layer 120 may be known through comparison with other element compositions in the measurement region.

Figure 1C:
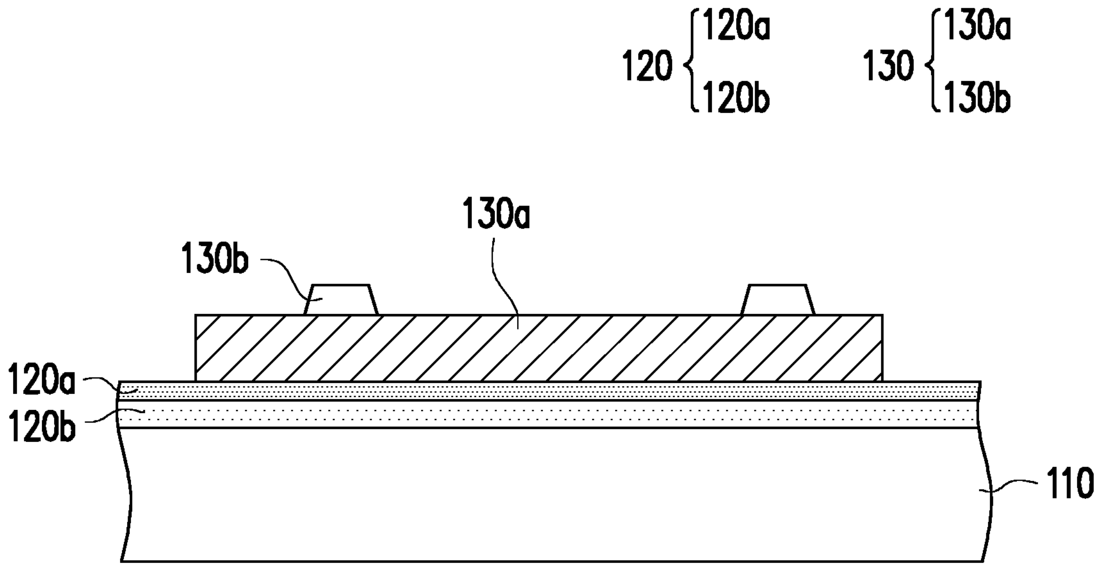

Referring to FIG. 1C, at least one heater 130 is then formed. The heater 130 is disposed on the first barrier layer 120, and may include a heating layer 130*a* and at least one electrode 130*b*. The electrode 130*b* may be located above, below or around the heating layer 130*a*, and the heating layer 130*a* and the electrode 130*b* contact with each other. In this embodiment, for instance, the electrode 130*b* is located above the heating layer 130*a*. In one embodiment, a material of the heating layer may include metal, metal oxide, a carbon-containing conductive material, or other suitable materials, where the metal may include titanium (Ti), silver (Ag), copper (Cu), aluminum (Al), or the like, the metal oxide may include indium tin oxide (ITO), or the like, and the carbon-containing conductive material may include graphene, carbon nanotube (CNT), carbon nanobud (CNB), poly(3,4-ethylenedioxythiophene) polystyrene sulfonate (PEDOT:PSS), or the like.

Figure 1D:
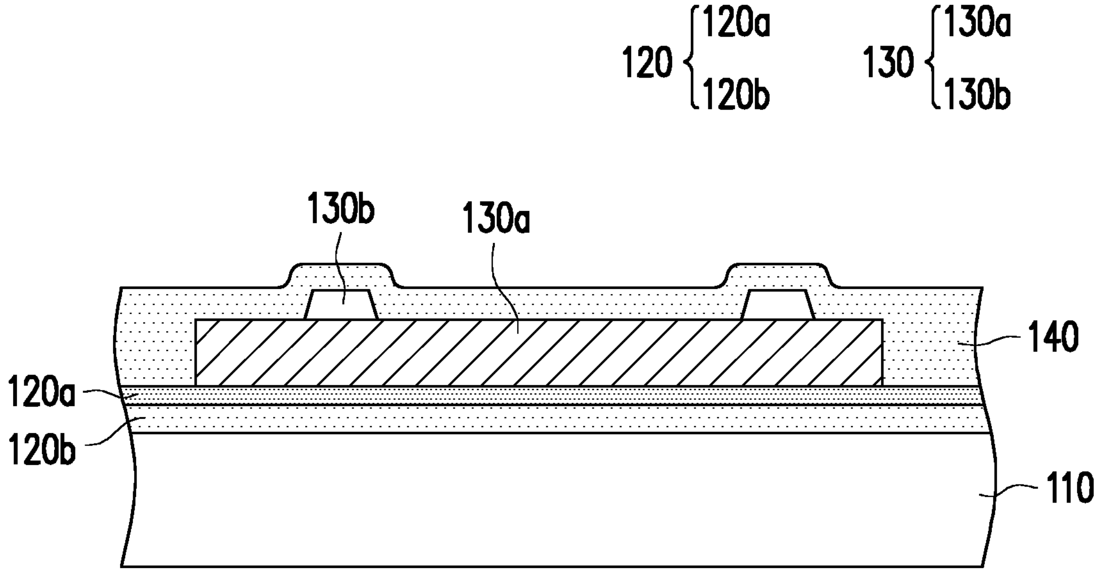

Referring to FIG. 1D, a second barrier layer 140 may be formed on the heater 130 through a solution process, and then the second barrier layer 140 is cured. The second barrier layer 140 may cover an upper surface and a sidewall of the heater 130. A material of the second barrier layer 140 used in the solution process may include polysilazane, polysiloxazane, or other suitable materials.

Figure 1E:
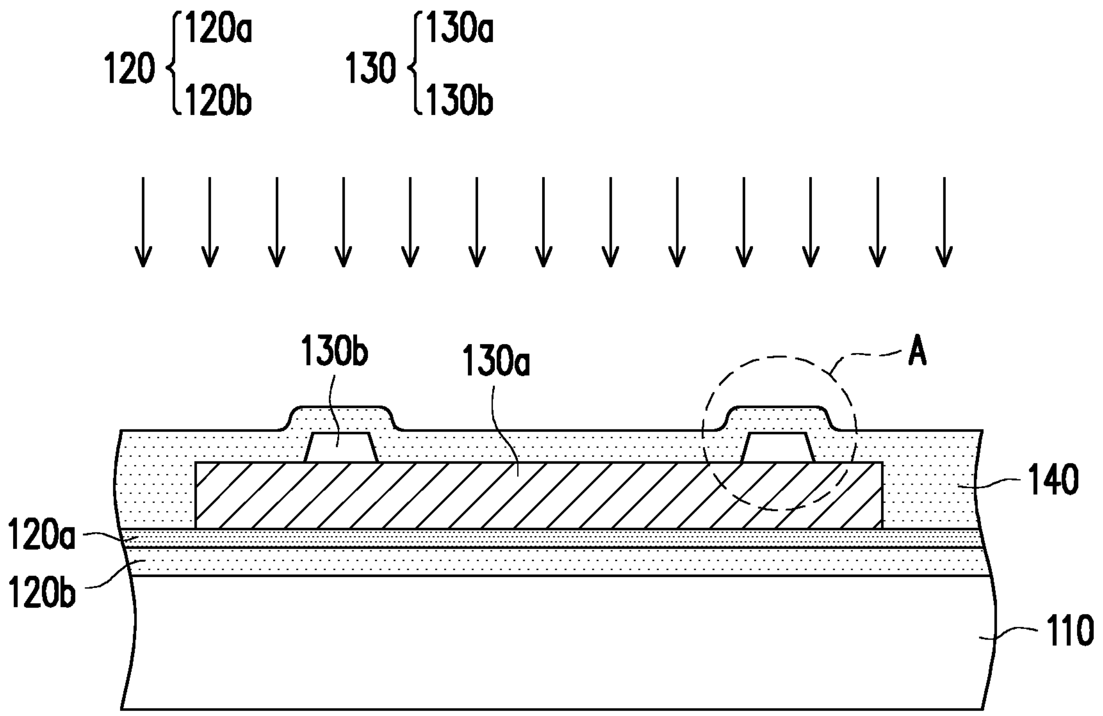

Then, referring to FIG. 1E, the exposed surface of the second barrier layer 140 may be modified by light, heat or plasma treatment to enhance barrier properties of the second barrier layer 140. The material of the modified second barrier layer 140 may include silicon nitride, silicon oxynitride, or other suitable materials.

Figure 1F:
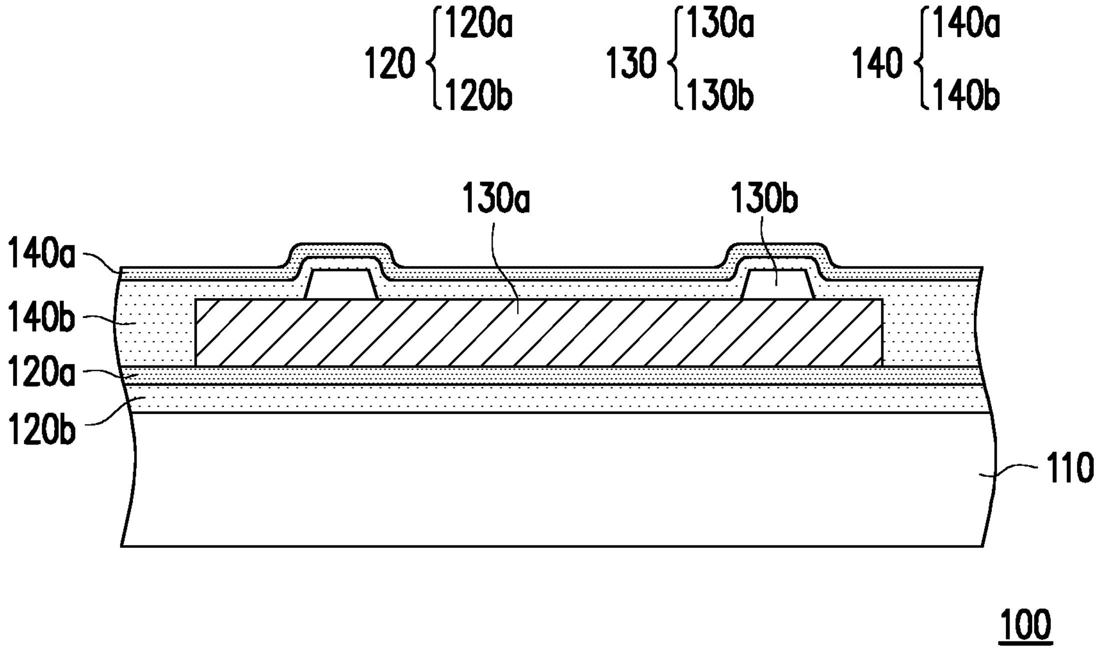

Then, referring to FIG. 1F, after the surface treatment, a second treatment layer 140*a* is formed on the second barrier layer 140 on a side away from the substrate 110, and therefore, the second barrier layer 140 has the second treatment layer 140*a* and an untreated layer 140*b*. The density of the second treatment layer 140*a* such as silicon nitride or silicon oxynitride is higher than the untreated layer 140*b*. In one embodiment, the nitrogen content in the second treatment layer 140*a* is more than in the untreated layer 140*b*. Further, in another embodiment, in consideration of flexibility of the heater package 100, the Young's modulus of the first barrier layer 120 and/or the second barrier layer 140 may be from 3 GPa to 10 GPa. In general, the composition of the second barrier layer 140 may include a nitrogen content from 5 at % to 20 at %, an oxygen content from 15 at % to 50 at %, and a silicon content from 30 at % to 50 at %, where the sum of the silicon element content, the nitrogen element content, and the oxygen element content may be 100 at %; a density of the second barrier layer 140 may be more than or equal to 2.2 g/$cm^3$, a water vapor transmission rate (WVTR) may be less than or equal to $10^{-1}$ g/$cm^2$-day, and a refractive index may be 1.50 to 1.55; a transmittance of visible light of the heater package 100 may be more than 80%. The second barrier layer 140 may be subject to element analysis in the same or similar manner as the first barrier layer 120 to obtain the composition of the second barrier layer 140.

In one embodiment, in order to prevent failure of the heater package 100 caused by excessive stress buildup during formation, adjustments may be made by controlling the thickness of the surface treatment of the first barrier layer 120 and/or the second barrier layer 140, so that the heater package 100 achieves a stress balance state. For instance, when the first barrier layer 120 and the substrate 110 are in a tensile stress state, the overall thickness of the first barrier layer 120 is 150 nm, and the thickness of the first treatment layer 120*a* thereof is less than about 20 nm. In this case, the thickness of the second treatment layer 140*a* of the second barrier layer 140 having the overall thickness of, for instance, 250 nm may be adjusted to a range of, for instance, more than or equal to 20 nm to less than 50 nm, so that the second barrier layer 140 is in a compressive stress state, thereby achieving stress balance of the heater package 100. When the first barrier layer 120 and the substrate 110 are in a compressive stress state, for instance, the overall thickness of the first barrier layer 120 is 250 nm, and the thickness of the first treatment layer 120*a* thereof is in a range of more than or equal to 20 nm to less than 50 nm, the thickness of the second treatment layer 140*a* of the second barrier layer 140 having an overall thickness of 150 nm, for instance, may be adjusted to be less than 20 nm, so that the second barrier layer 140 is in a tensile stress state, thereby achieving stress balance of the heater package 100. In one embodiment, the thickness of the surface treatment of the first treatment layer 120*a* and/or the second treatment layer 140*a* may be controlled by adjusting the processing time, applied voltage, illuminating wavelength, heating temperature, or the like. In general, a ratio of the thickness of the first treatment layer 120*a* to the thickness of the first barrier layer 120 and a ratio of the thickness of the second treatment layer 140*a* to the thickness of the second barrier layer 140, for instance, range from 0.03 to 0.2, which is beneficial to the control of the stress state of the heater package 100, thereby achieving stress balance of the heater package 100. In various embodiments, according to actual requirements, the adjustment may be performed as described above.

Figure 2:
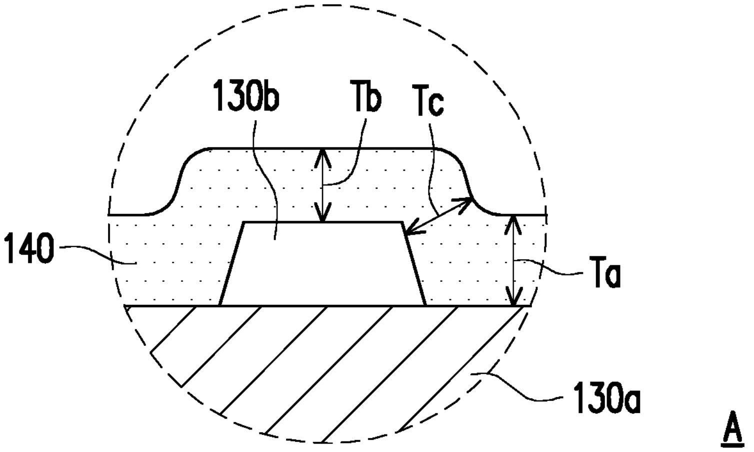
FIG. 2 is an enlarged partial cross-sectional view of a region A in FIG. 1E.

FIG. 2 is an enlarged partial cross-sectional view of a region A in FIG. 1E. The barrier layer was formed by the low-temperature solution process (for instance, lower than or equal to 120° C.), and it may cover well on the surface discontinuity, so that the surface with the discontinuity may be effectively covered, and the barrier effect may be maintained. Referring to FIG. 2, in this embodiment, the second barrier layer 140 is used as an example. The second barrier layer 140 covers the heating layer 130*a* and the upper surface and sidewall of the electrode 130*b*, the thickness of the second barrier layer 140 on the upper surface of the heating layer 130*a* includes Ta, the thickness of the second barrier layer 140 on the upper surface of the electrode 130*b* includes Tb, and the thickness of the second barrier layer 140 on the sidewall of the electrode 130*b* includes Tc. The upper coverage rate Tb/Ta of the second barrier layer 140 may be from 0.25 to 1, and the lateral coverage rate Tc/Ta may be from 0.25 to 1.

Figure 3:
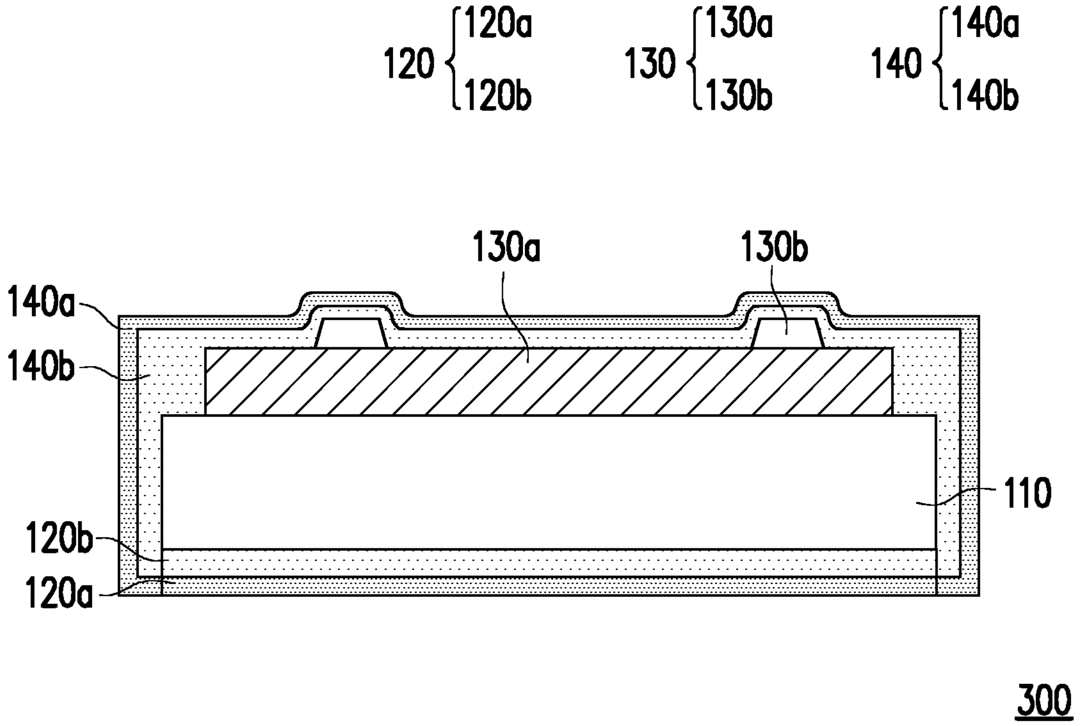
FIG. 3 is a schematic partial cross-sectional view of a heater package according to a second embodiment of the disclosure.

FIG. 3 is a schematic partial cross-sectional view of a heater package according to a second embodiment. The heater package 300 of the second embodiment is similar to the heater package 100 of FIG. 1F, and in FIG. 3, the same or similar reference numerals refer to the same or similar components, and therefore the components that have been described with respect to FIGS. 1A to 1F will not be described again here.

In the embodiment of the heater package 300, a first barrier layer 120 and a heater 130 are located on two opposite sides of the substrate 110 respectively. First, a first barrier layer 120 is formed on the substrate 110, and the first barrier layer 120 has good barrier properties after surface treatment. Then, a first treatment layer 120*a* is formed on the first barrier layer 120 on a side away from the substrate 110, and therefore, the first barrier layer 120 has the first treatment layer 120*a* and an untreated layer 120*b*. And then, a heater 130 is fabricated on the substrate 110 on the other side opposite to the first barrier layer 120, and the heater 130 is coated to form a second barrier layer 140, where the second barrier layer 140 may cover the heater 130 and the upper surface and the sidewall of the substrate 110. Then, the second barrier layer 140 is cured. After the surface treatment, the second barrier layer 140 has good barrier properties after surface treatment, and a second treatment layer 140*a* is formed on the second barrier layer 140 on a side away from the substrate 110, and therefore, the second barrier layer 140 has the second treatment layer 140*a* and an untreated layer 140*b*. By completely covering the heater package 300 with the first barrier layer 120 and the second barrier layer 140, it is advantageous to prevent the heater package 300 from being damaged by moisture and/or oxygen.

In another embodiment, the heater 130 may be formed on the substrate 110 first, and then a barrier layer may be formed around the heater package 300, for instance, by dip coating, a spray process, or other suitable processes, and the barrier layer completely covers the heater package. Then, the barrier layer is cured and surface treated to provide good barrier properties, thereby effectively preventing the heater package 300 from being damaged by moisture and/or oxygen.

Figure 4:
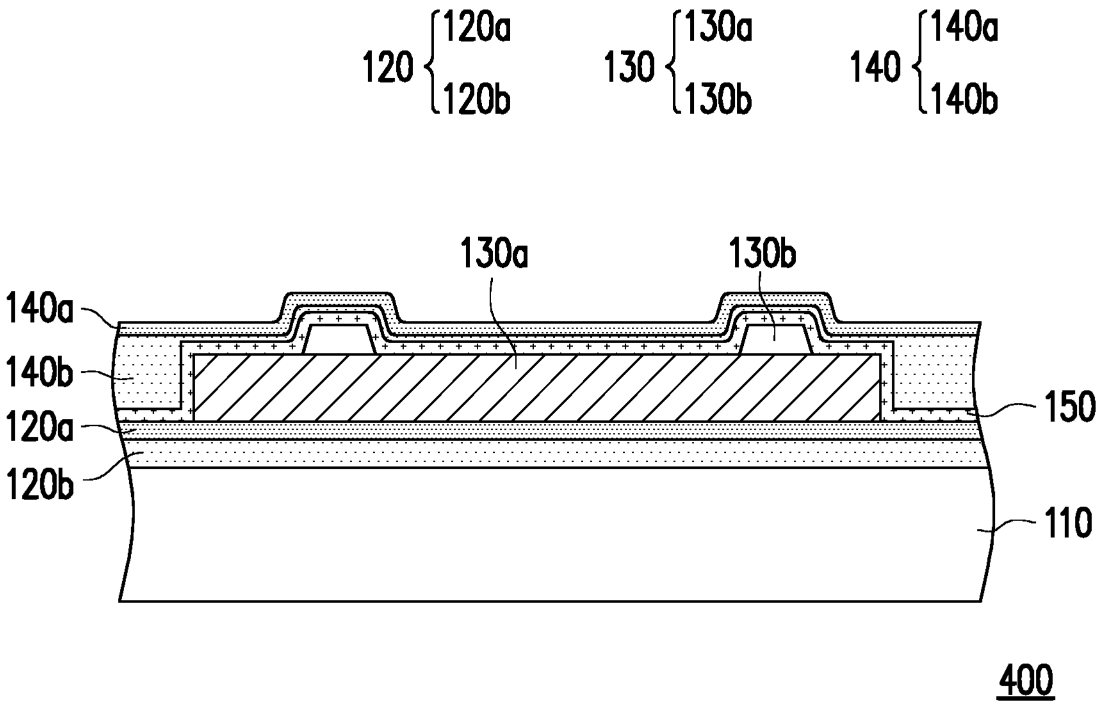
FIG. 4 is a schematic partial cross-sectional view of a heater package according to a third embodiment of the disclosure.

FIG. 4 is a schematic partial cross-sectional view of a heater package according to a third embodiment. The heater package 400 of the third embodiment is similar to the heater package 100 of FIG. 1F, and in FIG. 4, the same or similar reference numerals refer to the same or similar components, and therefore the components that have been described with respect to FIGS. 1A to 1F will not be described again here.

In the embodiment of the heater package 400, a third barrier layer 150 may be optionally formed on the heater 130, for instance, before the second barrier layer 140 is formed, and a thickness of the third barrier layer 150 is less than or equal to 50 nm. The third barrier layer 150 may use a similar or even same material as the first barrier layer 120, while the subsequent surface treatment is different based on different functional requirements, so that the third barrier layer 150 has good barrier properties as a fully treated layer. This helps to improve the interfacial adhesion between the third barrier layer 150 and the heater 130, and prevents peeling at the interface between the third barrier layer 150 and the heater 130, thereby maintaining the barrier effect of the third barrier layer 150. In one embodiment, the nitrogen content in the third barrier layer 150 is more than in the first barrier layer 120 and/or the second barrier layer 140.

According to various embodiments, one or more barrier layers and/or different functional film layers may be used according to requirements. The functional film layers may include a buffer layer, a hard coat, an optical film, a planarization layer, or an impact-resistant layer, and the like, so that the heater package may be applied to the fields of showcases, vehicles, household appliances, building curtains, demisting mirrors, intelligent wearable devices and the like. Various embodiments using at least one functional film layer are described below. Definitely, multiple functional film layers may be used together as desired.

Figure 5A:
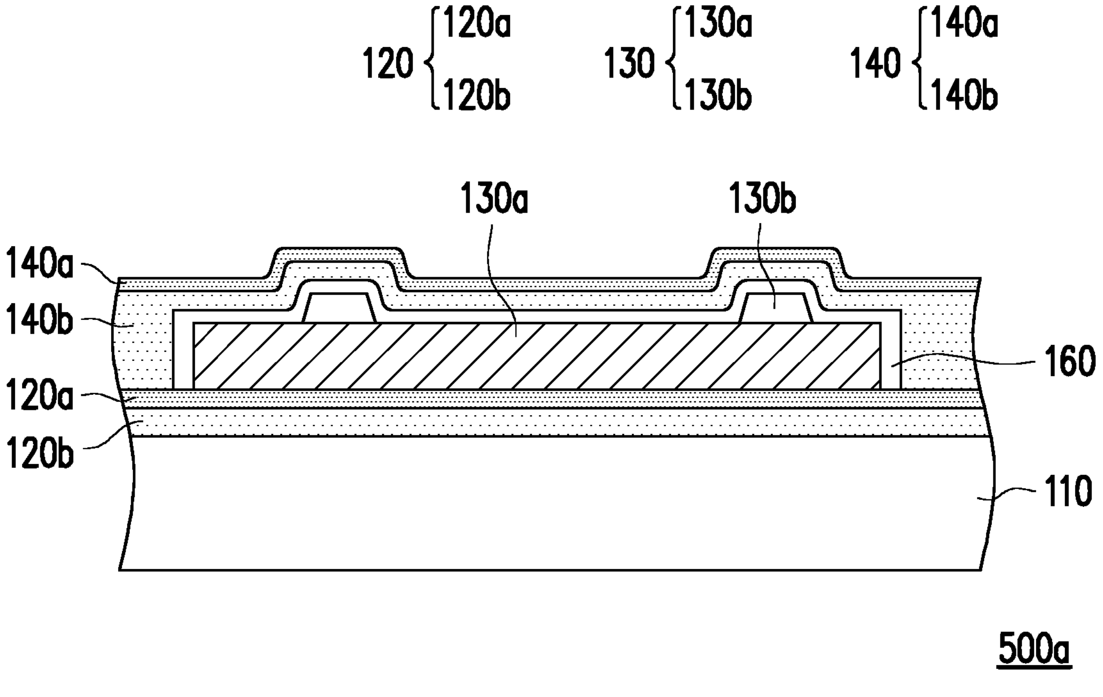
FIGS. 5A-5C are schematic partial cross-sectional views of a heater package according to a fourth embodiment to a sixth embodiment of the disclosure respectively.
Figure 5B:
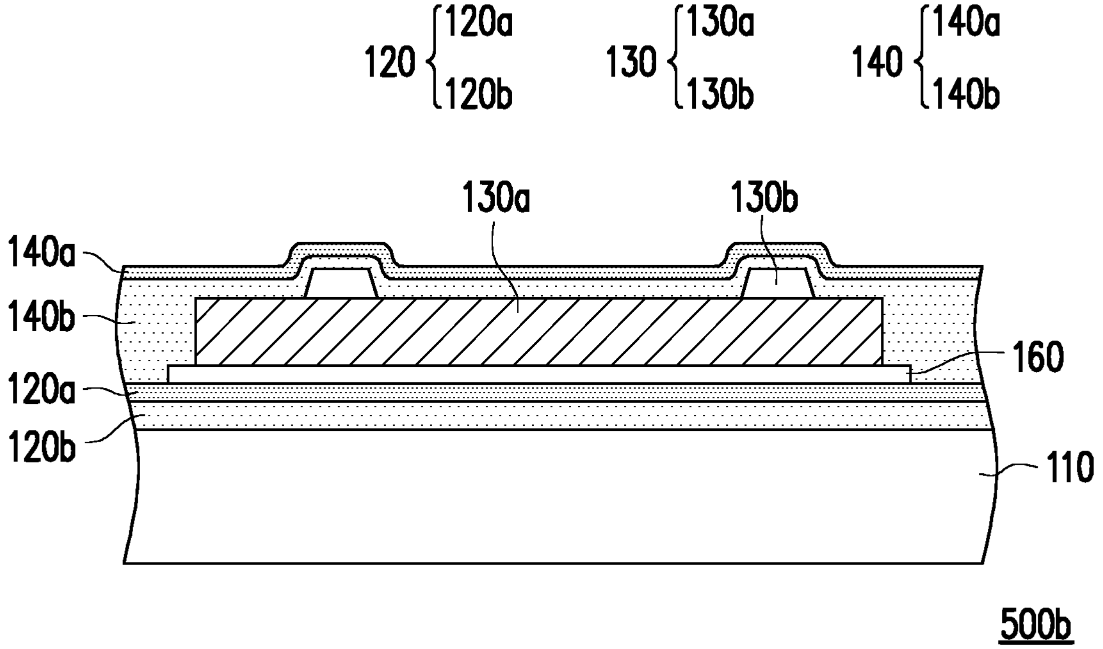
Figure 5C:
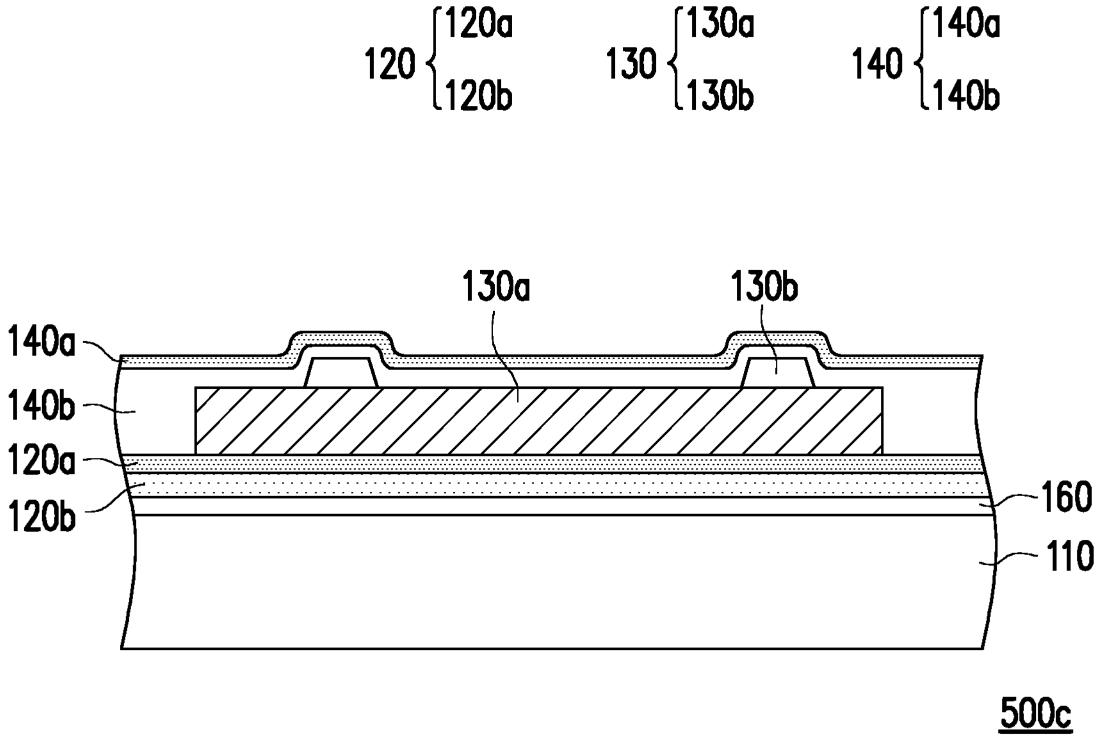

FIGS. 5A-5C are schematic partial cross-sectional views of a heater package according to a fourth embodiment to a sixth embodiment respectively. The heater packages 500*a*, 500*b*, and 500*c* of the fourth to sixth embodiments are similar to the heater package 100 of FIG. 1F, and in FIGS. 5A to 5C, the same or similar reference numerals refer to the same or similar components, and therefore the components that have been described with respect to FIGS. 1A to 1F will not be described again here.

Referring to FIG. 5A, in the embodiment of the heater package 500*a*, if the second barrier layer 140 affects the heater 130, a buffer layer 160 may be formed on the surface and sidewall of the heater 130 before the second barrier layer 140 is formed, so as to protect the heater 130. The buffer layer 160 may have a smaller area than the second barrier layer 140, facilitating subsequent coverage of the buffer layer 160 by the second barrier layer 140, thereby reducing moisture and/or oxygen that enter the heater package 500*a* laterally. In addition, in another embodiment, referring to the heater package 500*b* of FIG. 5B, the interfacial adhesion of the heater 130 may be enhanced by disposing the buffer layer 160 between the first barrier layer 120 and the heater 130. The buffer layer 160 may have a smaller area than the second barrier layer 140, facilitating subsequent coverage of the buffer layer 160 by the second barrier layer 140, and thereby reducing probability that moisture and/or oxygen enter the heater package 500*b* laterally. Further, in another embodiment, referring to the heater package 500*c* of FIG. 5C, if the first barrier layer 120 affects the substrate 110, the buffer layer 160 may be formed on the substrate 110 before the first barrier layer 120 is formed, so as to protect the substrate 110. The buffer layer 160 may serve to fill and/or cover surface defects.

The method of forming the buffer layer 160 may include ink-jet printing (IJP), plasma-enhanced chemical vapor deposition (PECVD), physical vapor deposition (PVD), sputter deposition, atomic layer deposition (ALD), or other suitable process methods. The material of the buffer layer 160 includes an organic material or an inorganic material, where the organic material may include an acrylic polymer, an epoxy polymer, polyimide, or a combination thereof, and the inorganic material may include metal oxide, such as aluminum oxide, indium tin oxide (ITO), or indium zinc oxide (IZO), and the like, silicon nitride, silicon oxynitride, silicon oxide or a combination thereof.

Figure 6:
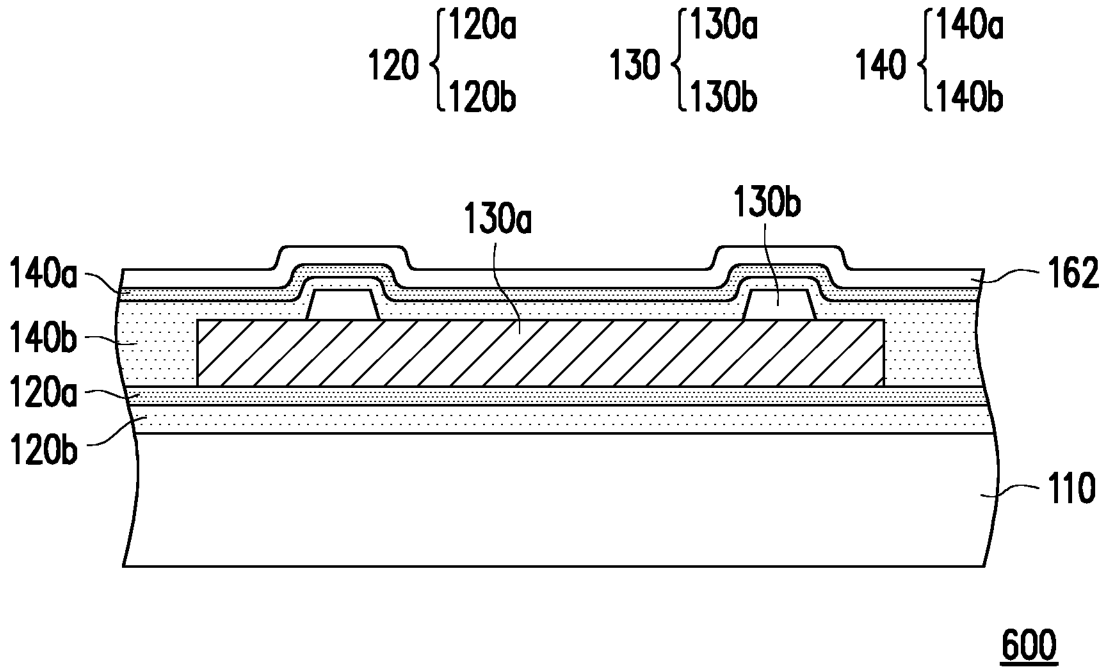
FIG. 6 is a schematic partial cross-sectional view of a heater package according to a seventh embodiment of the disclosure.

FIG. 6 is a schematic partial cross-sectional view of a heater package according to a seventh embodiment. The heater package 600 of the seventh embodiment is similar to the heater package 100 of FIG. 1F, and in FIG. 6, the same or similar reference numerals refer to the same or similar components, and therefore the components that have been described with respect to FIGS. 1A to 1F will not be described again here.

In the embodiment of the heater package 600, a hard coat 162 may be optionally formed on the outermost layer, for instance, the second barrier layer 140, to enhance the scratch and abrasion resistance properties of the heater package 600, and the hardness of the hard coat 162 may, for instance, range from 1H to 9H, where H is pencil hardness. Further, in another embodiment, the hardness of the second barrier layer 140, for instance, ranges from 1H to 9H; that is, the second barrier layer 140 is scratch and abrasion resistant, so the hard coat 162 is not needed.

Figure 7A:
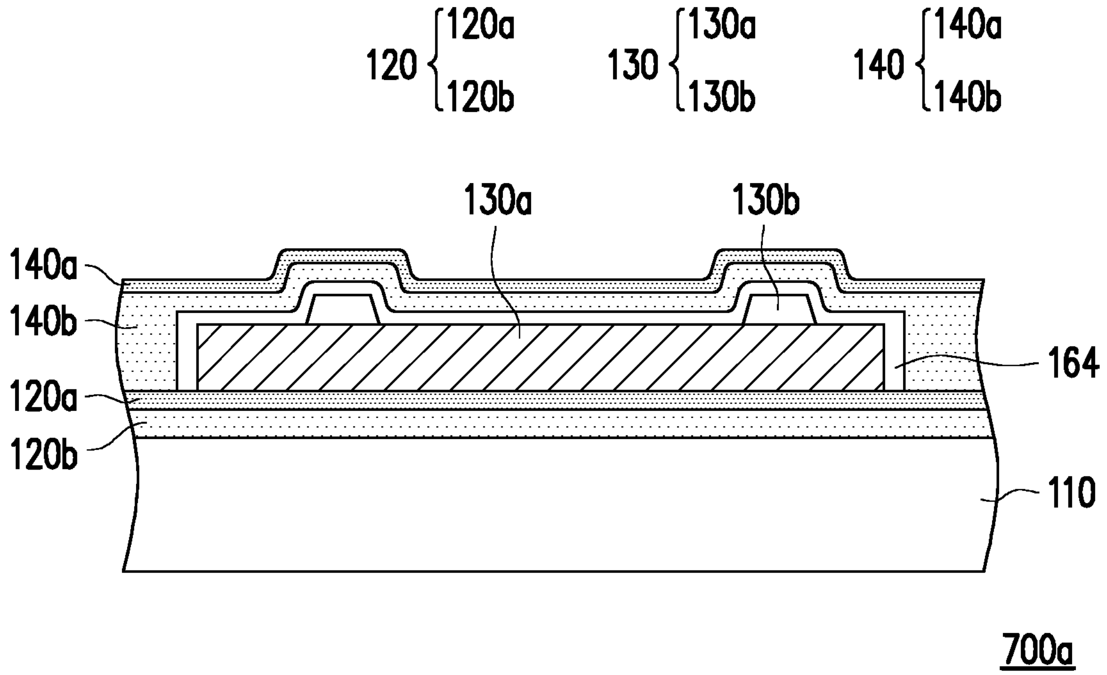
FIGS. 7A-7C are schematic partial cross-sectional views of a heater package according to an eighth embodiment to a tenth embodiment of the disclosure respectively.
Figure 7B:
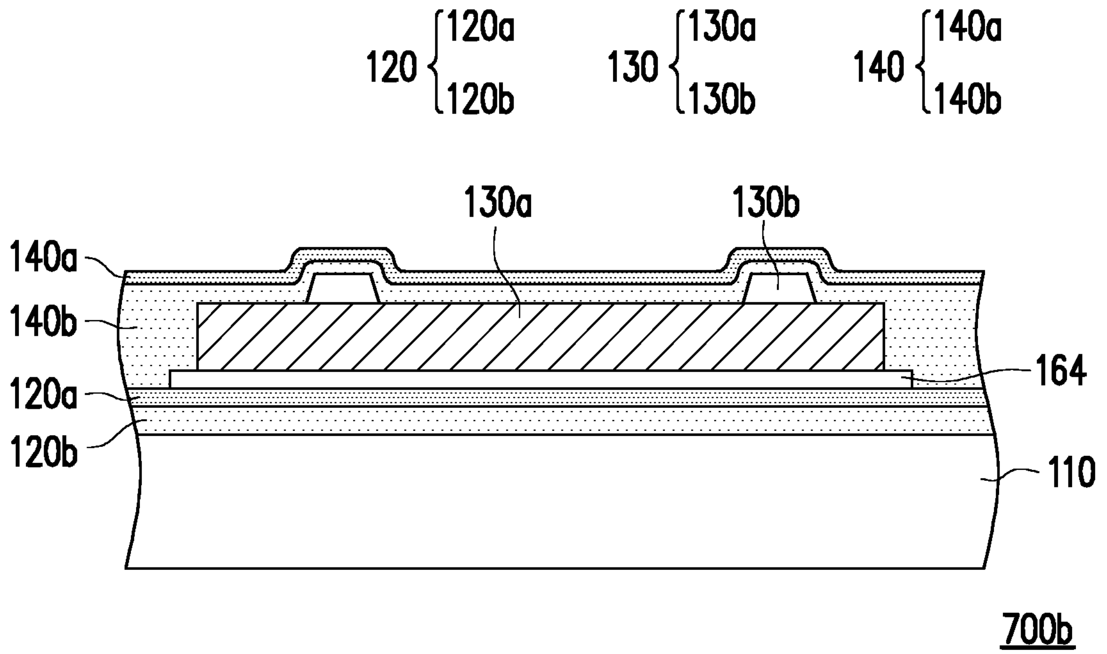
Figure 7C:
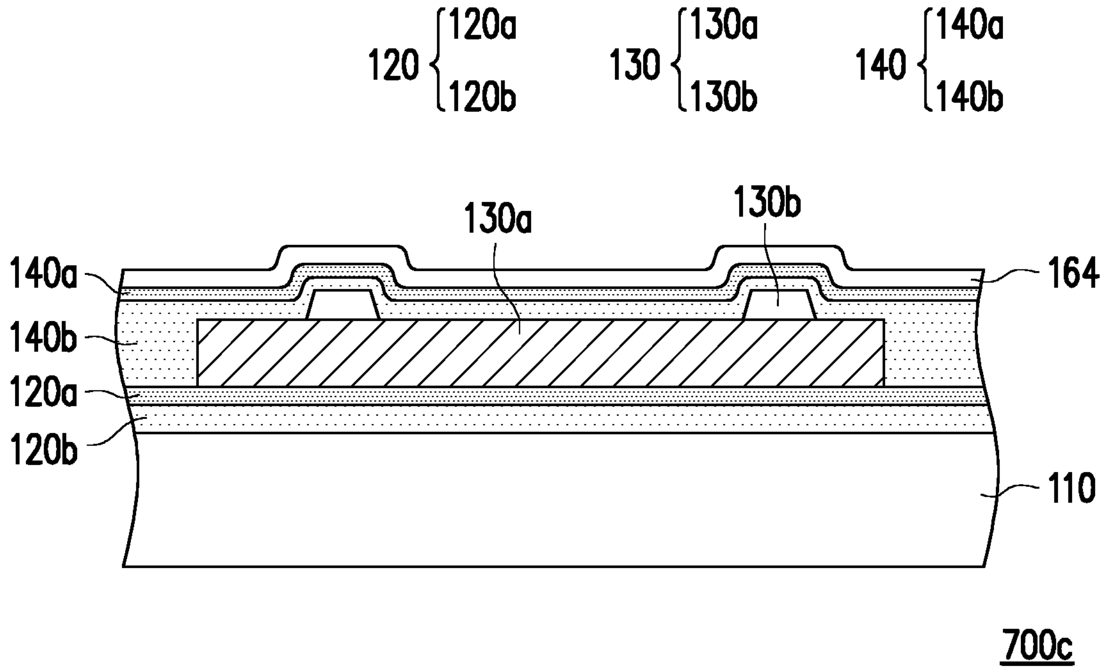

FIGS. 7A-7C are schematic partial cross-sectional views of a heater package according to an eighth embodiment to a tenth embodiment respectively. The heater packages 700*a*, 700*b*, and 700*c* of the eighth to tenth embodiments are similar to the heater package 100 of FIG. 1F, and in FIGS. 7A to 7C, the same or similar reference numerals refer to the same or similar components, and therefore the components that have been described with respect to FIGS. 1A to 1F will not be described again here.

Referring to FIG. 7A, in the embodiment of the heater package 700*a*, an optical film 164 may be disposed between the heater 130 and the second barrier layer 140. The optical film 164 includes an optical matching layer having a refractive index more than or equal to 1.5 and less than or equal to the refractive index of the substrate 110, thereby improving the transmittance of visible light of the heater package 700*a*. Further, in another embodiment, the optical film 164 may include a dimming layer. A material of the dimming layer includes a photochromic material or an electrochromic material. The photochromic material may include halogenide and the electrochromic material may include metal oxide, so that the heater package 700*a* may be applied to a smart window of, for instance, a vehicle or a building. In this way, the brightness and the color of the ambient light entering the vehicle or the building are adjusted. The optical film 164 may have a smaller area than the second barrier layer 140, facilitating subsequent coverage of the optical film 164 by the second barrier layer 140, thereby reducing moisture and/or oxygen that enter the heater package 700*a* laterally.

In another embodiment, referring to FIG. 7B, in the heater package 700*b*, an optical film 164 may be disposed between the heater 130 and the first barrier layer 120. The optical film 164 may include a dimming layer. A material of the dimming layer includes a photochromic material or an electrochromic material, so that the heater package 700*b* may be applied to a smart window of, for instance, a vehicle or a building. In this way, the brightness and the color of the ambient light entering the vehicle or the building are adjusted. The optical film 164 may have a smaller area than the second barrier layer 140, facilitating subsequent coverage of the optical film 164 by the second barrier layer 140, thereby reducing moisture and/or oxygen that enter the heater package 700*b* laterally.

In another embodiment, referring to the heater package 700*c* of FIG. 7C, an optical film 164 may be disposed on the second barrier layer 140. The optical film 164 may include an anti-reflection layer, which may have a refractive index of, for instance, from 1 to 1.7, thereby increasing the transmittance of visible light to the heater package 700*c*. Additionally, in one embodiment, the optical film 164 may include an anti-ultraviolet (UV)/anti-infrared (IR) layer, the anti-UV/IR layer having an anti-UV transmittance more than 90% and an anti-IR transmittance more than 20%. The heater package 700*c* may be applied to a smart window of, for instance, a vehicle or a building, to reduce the ultraviolet/infrared light from ambient light that enters the vehicle or the building, thereby achieving a sun protection and thermal insulation effect.

Figure 8A:
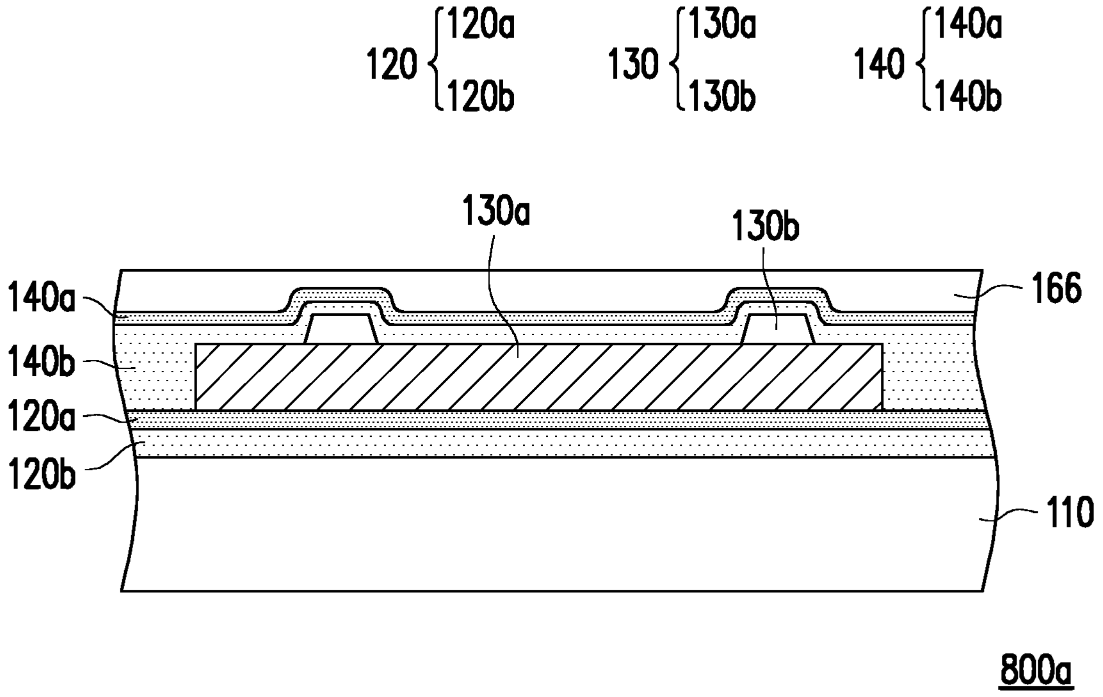
FIGS. 8A and 8B are schematic partial cross-sectional views of a heater package according to an eleventh embodiment and a twelfth embodiment of the disclosure respectively.
Figure 8B:
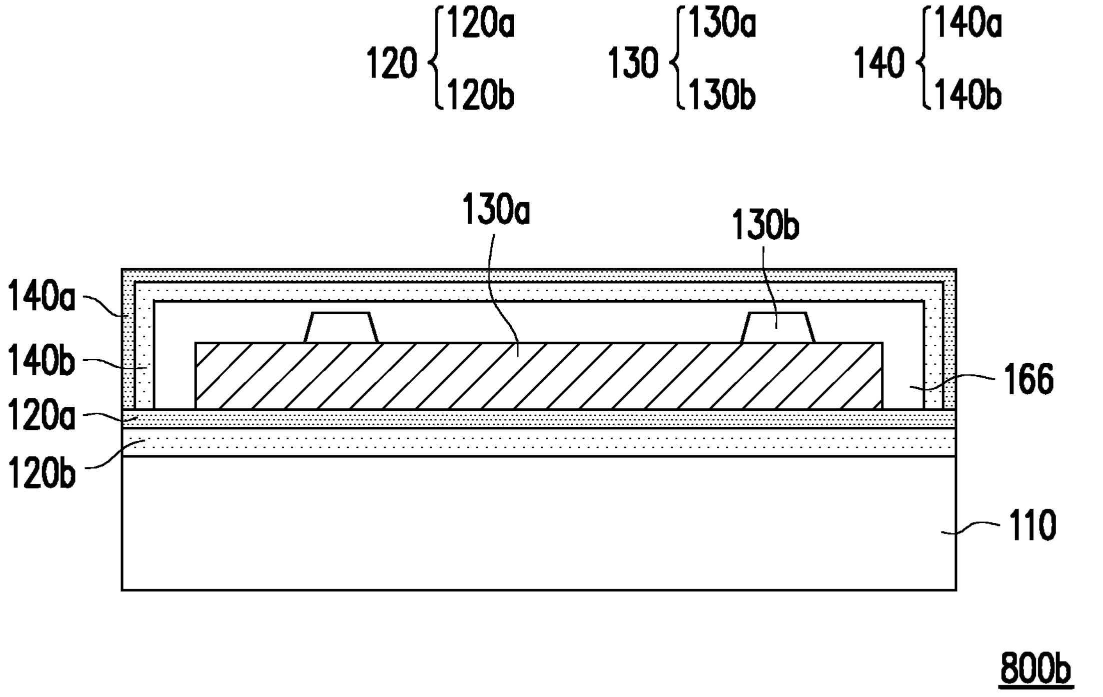

FIGS. 8A and 8B are schematic partial cross-sectional views of a heater package according to an eleventh embodiment and a twelfth embodiment respectively. The heater packages 800*a* and 800*b* of the eleventh and twelfth embodiments are similar to the heater package 100 of FIG. 1F, and in FIGS. 8A and 8B, the same or similar reference numerals refer to the same or similar components, and therefore the components that have been described with respect to FIGS. 1A to 1F will not be described again here.

Referring to FIG. 8A, in the embodiment of the heater package 800*a*, if the second barrier layer 140 may not form a flat surface on the heater 130, a planarization layer 166 may be fabricated on the second barrier layer 140 to improve the adhesion performance when an adhesive is attached subsequently. The planarization layer 166 may be fabricated, for instance, by ink-jet printing (IJP), slot die coating, spin coating, or other suitable process methods.

In another embodiment, referring to the heater package 800*b* of FIG. 8B, the heater package 800*b* having barrier properties and a flat surface is formed by first fabricating a planarization layer 166 on the heater 130 and then covering the surface and sidewall of the planarization layer 166 with the second barrier layer 140, to improve the adhesion performance when an adhesive is attached subsequently.

Figure 9A:
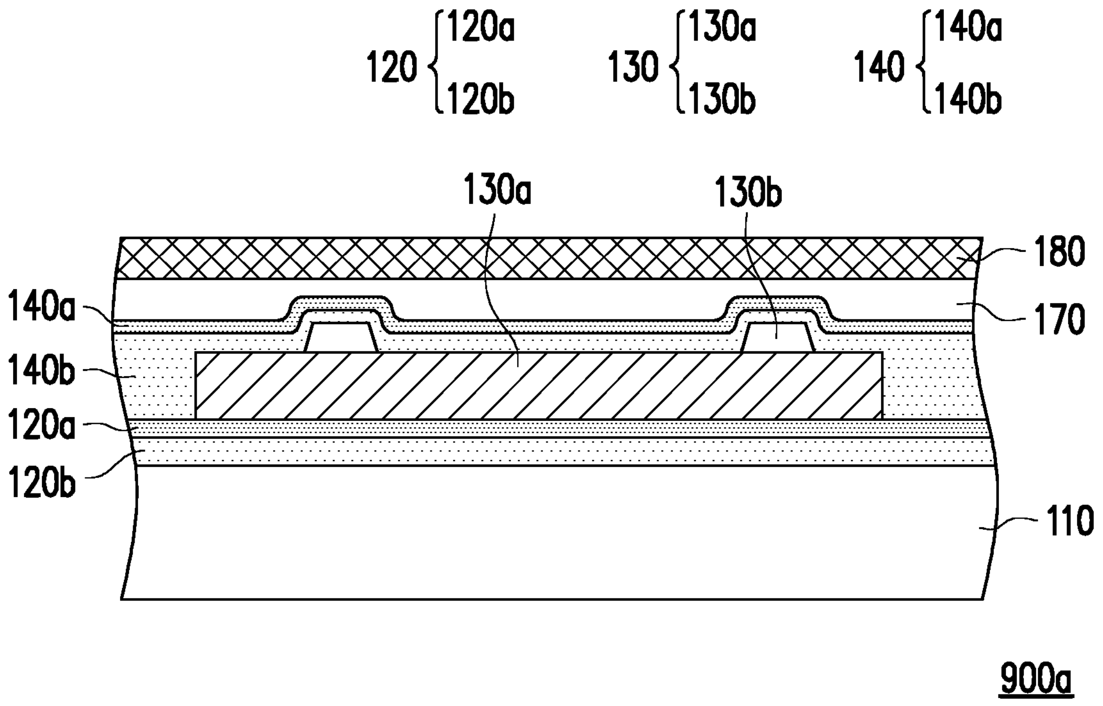
FIGS. 9A and 9B are schematic partial cross-sectional views of a heater package according to a thirteenth embodiment and a fourteenth embodiment of the disclosure respectively.
Figure 9B:
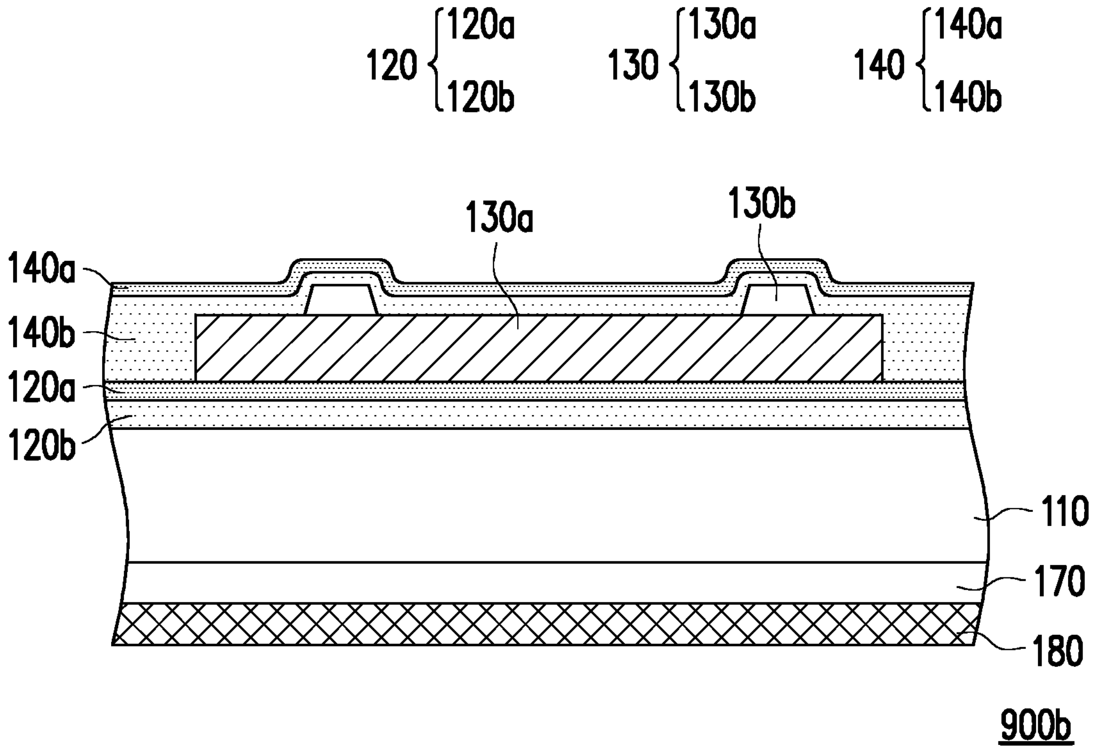

FIGS. 9A and 9B are schematic partial cross-sectional views of a heater package according to a thirteenth embodiment and a fourteenth embodiment respectively. The heater packages 900*a* and 900*b* of the thirteenth and fourteenth embodiments are similar to the heater package 100 of FIG. 1F, and in FIGS. 9A and 9B, the same or similar reference numerals refer to the same or similar components, and therefore the components that have been described with respect to FIGS. 1A to 1F will not be described again here.

In this embodiment, an adhesive 170 may be used to attach a cover film 180 to the outermost layer; that is, the adhesive 170 is disposed between the cover film 180 and the second barrier layer 140 (as shown in the heater package 900*a* of FIG. 9A), or the adhesive 170 is disposed between the cover film 180 and the substrate 110 (as shown in the heater package 900*b* of FIG. 9B). The adhesive 170 may include an optically clear adhesive (OCA), or other suitable materials. The cover film 180 may use a functional film layer including a substrate 110 with flexibility, a hard coat 162, an optical film 164, or an impact-resistant structure, where the substrate 110 with flexibility, the hard coat 162, and the optical film 164 have been described in the foregoing embodiments, and will not be described again here.

In one embodiment, the impact-resistant structure may include a composite material formed by a laminate of a soft material and a hard material, the impact strength of the soft material is, for instance, more than 2 $kg\text{-}cm/cm^2$, and may include a polycarbonate (PC) fiber layer, polyvinyl butyral resin (PVB), or other suitable organic materials; the hard material may include glass, polycarbonate (PC) board, or other suitable materials. The toughness and impact strength of the heater packages 900*a* and 900*b* may be effectively improved by attaching the impact-resistant structure.

The heater package according to one embodiment of the disclosure, the upper surface, the lower surface, and the sidewall of the heater are covered by the first barrier layer and/or the second barrier layer, and exposed surfaces of the first barrier layer and/or the second barrier layer are modified, so that the first barrier layer and/or the second barrier layer has good barrier properties, and the heater is protected and is less apt to be affected by moisture and/or oxygen. In addition, by adjusting thicknesses of the modified surface of the first barrier layer and the modified surface of the second barrier layer, the heater package body reaches a stress balance state. Moreover, according to various embodiments, one or more barrier layers and/or different functional film layers may be used according to requirements, so that the heater package may be applied to the fields of showcases, vehicles, household appliances, building curtains, demisting mirrors, intelligent wearable devices and the like.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A heater package, comprising:

a substrate;

a first barrier layer, disposed on a surface of the substrate, and comprising a first treatment layer on a side away from the substrate;

at least one heater, disposed on the substrate, and comprising a heating layer and at least one electrode, wherein the at least one electrode and the heating layer are in contact with each other; and a second barrier layer, covering an upper surface and a sidewall of the at least one heater, and having a second treatment layer on an opposite side or the side away from the substrate, wherein a ratio of a thickness of the first treatment layer to a thickness of the first barrier layer and a ratio of a thickness of the second treatment layer to a thickness of the second barrier layer range from 0.03 to 0.2.

2. The heater package according to claim 1, wherein the thickness of the first treatment layer and the thickness of the second treatment layer are less than 50 nm.

3. The heater package according to claim 1, wherein a composition of the first barrier layer comprises a nitrogen content from 5 at % to 30 at %, an oxygen content from 20 at % to 50 at %, and a silicon content from 30 at % to 50 at %, and a refractive index of the first barrier layer ranges from 1.50 to 1.60.

4. The heater package according to claim 1, wherein a composition of the second barrier layer comprises a nitrogen content from 5 at % to 20 at %, an oxygen content from 15 at % to 50 at %, and a silicon content from 30 at % to 50 at %, and a refractive index of the second barrier layer is from 1.50 to 1.55.

5. The heater package according to claim 1, wherein the second barrier layer has an upper coverage rate and a lateral coverage rate, and the upper coverage rate and the lateral coverage rate range from 0.25 to 1.

6. The heater package according to claim 1, wherein a hardness of the second barrier layer ranges from 1H to 9H.

7. The heater package according to claim 1, wherein the second barrier layer further covers a sidewall of the substrate.

8. The heater package according to claim 1, further comprising a third barrier layer, wherein the third barrier layer is disposed between the at least one heater and the second barrier layer.

9. The heater package according to claim 1, further comprising a buffer layer, wherein the buffer layer is disposed between the substrate and the first barrier layer, between the at least one heater and the first barrier layer, or between the at least one heater and the second barrier layer.

10. The heater package according to claim 9, wherein a material of the buffer layer comprises an organic material or an inorganic material, the organic material comprises an acrylic polymer, an epoxy polymer, polyimide, or a combination thereof, and the inorganic material comprises metal oxide, silicon nitride, silicon oxynitride, silicon oxide, or a combination thereof.

11. The heater package according to claim 1, further comprising a hard coat, wherein the hard coat is disposed on the second barrier layer, and a hardness of the hard coat ranges from 1H to 9H.

12. The heater package according to claim 1, further comprising an optical film, wherein the optical film is disposed between the at least one heater and the first barrier layer, between the at least one heater and the second barrier layer, or on the second barrier layer.

13. The heater package according to claim 12, wherein the optical film comprises an anti-reflection layer, and a refractive index of the anti-reflection layer ranges from 1 to 1.7.

14. The heater package according to claim 12, wherein the optical film comprises an optical matching layer, and a refractive index of the optical matching layer is more than or equal to 1.5 and is less than or equal to a refractive index of the substrate.

15. The heater package according to claim 12, wherein the optical film comprises an anti-ultraviolet/anti-infrared layer, and the anti-ultraviolet/anti-infrared layer comprises an anti-ultraviolet transmittance more than 90% and an anti-infrared transmittance more than 20%.

16. The heater package according to claim 12, wherein the optical film comprises a dimming layer, and a material of the dimming layer comprises a photochromic material or an electrochromic material, wherein the photochromic material comprises halogenide, and the electrochromic material comprises metal oxide.

17. The heater package according to claim 1, further comprising a planarization layer, wherein the planarization layer is disposed between the at least one heater and the second barrier layer or on the second barrier layer.

18. The heater package according to claim 1, further comprising an adhesive and a cover film, wherein the adhesive is disposed between the cover film and the substrate or between the cover film and the second barrier layer.

19. The heater package according to claim 18, wherein the cover film comprises the substrate with flexibility, a hard coat, an optical film, or an impact-resistant structure.

20. A heater package, comprising:

a substrate;

at least one heater, disposed on the substrate, and comprising a heating layer and at least one electrode, wherein the at least one electrode and the heating layer are in contact with each other; and a first barrier layer, covering an upper surface, a lower surface, and a sidewall of the substrate and an upper layer and a sidewall of the at least one heater, and comprising a first treatment layer on a side away from the substrate, wherein a ratio of a thickness of the first treatment layer to a thickness of the first barrier layer ranges from 0.03 to 0.2.

* * * * *